(12) United States Patent
Choa

(10) Patent No.: US 6,337,871 B1
(45) Date of Patent: Jan. 8, 2002

(54) MULTIPLE EDGE-EMITTING LASER COMPONENTS LOCATED ON A SINGLE WAFER AND THE ON-WAFER TESTING OF THE SAME

(75) Inventor: Fow-Sen Choa, Baltimore, MD (US)

(73) Assignee: University of Maryland Baltimore County (UMBC), Baltimore, MD (US)

( * ) Notice: Subject to any disclaimer, the term of this patent is extended or adjusted under 35 U.S.C. 154(b) by 0 days.

(21) Appl. No.: 09/353,792

(22) Filed: Jul. 15, 1999

(51) Int. Cl.[7] .............................. H01S 5/00; H01S 3/08
(52) U.S. Cl. .......................... 372/45; 372/96; 372/102; 372/43
(58) Field of Search .............................. 372/45, 43, 96, 372/102

(56) References Cited

U.S. PATENT DOCUMENTS

| | | | | |
|---|---|---|---|---|
| 4,894,835 A | * | 1/1990 | Uomi et al. ................... | 372/45 |
| 6,052,399 A | * | 4/2000 | Sun ............................... | 372/50 |
| 6,057,918 A | * | 5/2000 | Geary et al. ................... | 356/50 |
| 6,104,739 A | * | 8/2000 | Hong et al. ................... | 372/50 |
| 6,108,355 A | * | 8/2000 | Zorabedian ................... | 372/20 |
| 6,121,634 A | * | 9/2000 | Saito et al. ................... | 257/86 |

* cited by examiner

Primary Examiner—James W. Davie
Assistant Examiner—James Menefee
(74) Attorney, Agent, or Firm—Fleshner & Kim, LLP

(57) ABSTRACT

An edge-emitting laser having an edge-emitting output and a surface-emitting output. The edge-emitting laser has a resonator having a high order grating, preferably a second order grating capable of producing an edge-emitting component and a surface-emitting component. A waveguide is also located in the resonator and a cap layer is located above the waveguide and grating. The cavity is tested by taking measurements from the surface-emitting component eliminating the need for taking measurements from the edge-emitting component which is time consuming and expensive.

9 Claims, 2 Drawing Sheets

MULTIPLE EDGE-EMITTING LASER COMPONENTS LOCATED ON A SINGLE WAFER AND THE ON-WAFER TESTING OF THE SAME

FIELD OF THE INVENTION

This invention relates to multiple edge-emitting lasers manufactured on a single wafer and also relates to testing of the lasers while still located on the wafer. This is called "on-wafer" testing.

BACKGROUND OF THE INVENTION

Edge-emitting lasers are lasers that emit outputs in a horizontal direction through the edges of a laser. When manufacturing edge-emitting lasers, multiple laser cavities (resonators) are usually formed in parallel strips on the surface of a single wafer using a first order grating. Each strip is divided into multiple segments to form multiple coaxial lasers on the wafer so that each edge of the lasers can be exposed horizontally for testing.

On-wafer testing is critical for achieving low cost production of edge-emitting lasers or Distributed Feedback (DFB) lasers by avoiding the testing of each individual die. Assuming the cost of labor is $20 per hour, a worker can only spend minutes testing each individual device to achieve a goal of $20 per die. Any time spent on testing an individual device will add significant cost to the final product. However, if an entire wafer containing 25,000 dies could be automatically tested in even an hour, the cost per die will be dramatically reduced.

For the traditional edge-emitting laser fabrication process, laser testing has to be done after bar cleaving when the length of the laser cavity is determined. Bar cleaving is a process which breaks the wafer into multiple individual pieces defining the length of each laser cavity.

For telecommunications lasers such as a Distributed Feedback laser (DFB), the testing of the laser cannot be done until after the bar cleaving step. Therefore, a large portion of the manufacturing costs occurs during laser testing.

On-wafer testing will reduce the cost of production of edge-emitting lasers and more particularly DFB lasers due to the reduction of testing cost.

Conventional testing of each edge-emitting laser requires emitting and measuring the outputs emitted through the edges of the laser. However, this is not possible to do on a single wafer because the edges from which the outputs are emitted are too close to one another. Therefore, the wafer must be subjected to a cleaving process which breaks the wafer into multiple individual pieces, each individual piece being a single edge emitting laser. The output of each individual laser which is emitted through the edges of the laser is then tested for quality assurance.

SUMMARY OF THE INVENTION

The present invention improves upon the present testing of edge-emitting lasers by allowing for on-wafer testing of edge-emitting lasers located on a single wafer. On-wafer testing is an improvement over the current method of testing because it eliminates the cleaving process which breaks the wafer into multiple individual pieces. The cleaving process is eliminated by substituting a high order grating for the first order grating typically used in edge-emitting lasers. By substituting a high order grating for the typical first order grating, an output is not only emitted through the edges of the laser but outputs are also emitted through the surface of the laser. Measurements can therefore be easily taken from the surface of the wafer without cleaving or breaking the wafer into multiple pieces.

An edge-emitting laser of the present invention comprises a substrate; an insulating layer located on said substrate defining a first channel having insulating layers located on either side of said first channel; a high order grating layer located in said first channel wherein said high order grating layer has an order greater than a first order grating layer; a waveguide located on top of said grating layer; and a cap layer located on top of said waveguide and said insulating layers.

In an alternate embodiment, a component of an edge-emitting laser comprises a first resonator; a grating located in said first resonator having a grating order greater than one; a waveguide located in said first resonator; a cap layer located above said waveguide and said grating wherein said first resonator has an edge-emitting component being transmitted through said first resonator and a surface-emitting component being transmitted in a different direction than said edge-emitting component.

An edge-emitting laser of the present invention may further comprise a high order grating layer that is a second order grating layer located in a first channel and also comprises a second channel that is co-axial to said first channel. A cap layer may have an opening located above said waveguide and also comprises metal slabs located on either side of said opening.

A method for fabricating an edge-emitting laser cavity of the present invention comprises the steps of providing a substrate; forming an insulating layer on said substrate defining a first channel having insulating layers located on either side of said first channel; forming a high order grating layer in said first channel wherein said high order grating layer is greater than a first order grating layer; forming a waveguide over said grating layer; and forming a cap layer over said waveguide and said insulating layers.

In an alternate embodiment, a method for the fabrication of a component of an edge-emitting laser comprises the steps of forming a first resonator; forming a high order grating layer in said first resonator wherein said high order grating layer is of an order greater than one; forming a waveguide in said first resonator; and forming a cap layer over said waveguide and said first resonator.

The method of for the fabrication of an edge-emitting laser cavity in accordance with the present invention may further comprise forming said high order grating layer as a second order high order grating layer and also comprises forming a second channel being co-axial to said first channel. The method further comprises etching across said insulating layer and said first channel forming two or more channels and also comprises forming an opening in said cap layer above said waveguide. In addition, the method further comprises forming metal slabs on either side of said opening and also etching an opening above said waveguide in said cap layer.

A method for testing edge emitting-lasers located on a single substrate comprises the step of taking measurements from each surface-emitting component of said lasers.

In an alternate embodiment, the method for testing edge-emitting lasers located on a single substrate further comprises the step of taking said measurements using a lensed fiber and an electrode.

BRIEF DESCRIPTION OF THE DRAWINGS

The invention is described below with reference to the accompanying figures wherein.

DETAILED DESCRIPTION

Figure 1:
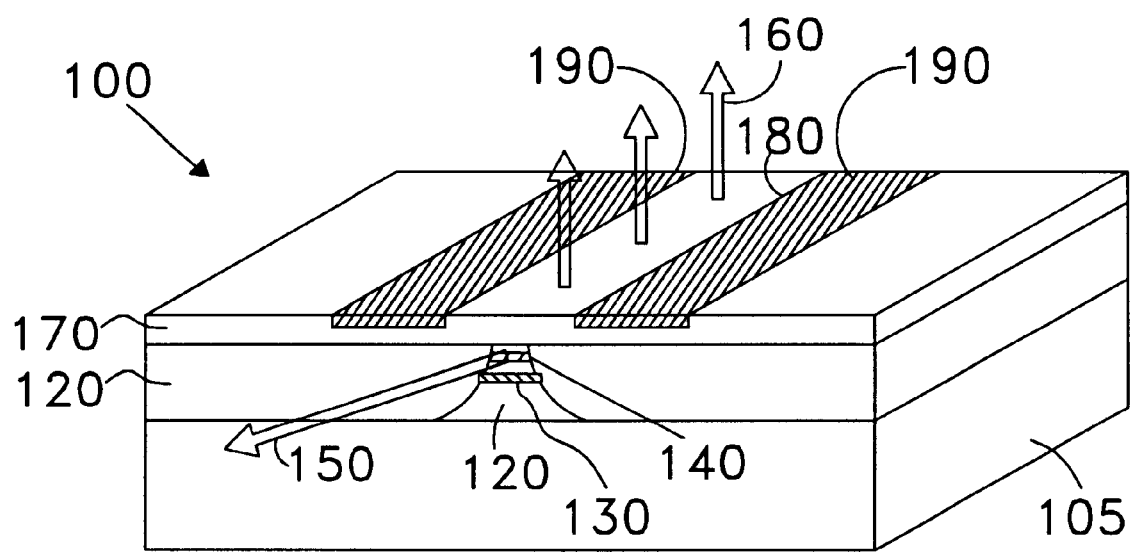
FIG. 1 is a perspective view of a single edge-emitting laser located on a single wafer.

The present invention is drawn to an edge-emitting laser and a method of manufacturing and testing the laser. Referring to FIG. 1 the laser 100 comprises a substrate layer 105. Substrate layer 105 is preferably an N-Substrate although it can also be other types of substrates such as a P-Substrate.

Located above substrate layer 105 is an insulating layer 110. At least one channel 120 is located in insulating layer 110 so that portions of insulating layer 110 are located on either side of channel 120. Insulating layer 110 blocks current from flowing outside of channel 120 and is usually a regrown semi-insulating material such as a Semi Insulating Indium Phosphate (SI InP) preferably iron doped.

Located inside channel 120 is a grating layer 130 and a waveguide stripe 140 is located above the grating layer 130. Grating layer 130 is a second order grating which during operation permits feedback and coupling of outputs in a horizontal, lengthwise axial direction through channel 120 depicted by an arrow 150 representing an edge-emitting component and also in a normal direction with respect to channel 120 depicted by an arrow 160 representing a surface-emitting component. Although second order gratings are commonly present in surface-emitting lasers, second order gratings are not used in edge-emitting communication lasers. It is noted that grating layer 130 could be any grating order greater than a first order grating such as a second order grating, third order grating or a fourth order grating. The advantage of using high order gratings is that light is reflected back to the laser cavity to help the laser reach a lasing condition. However, as the grating layer order increases the light will also scatter toward the surface of the laser instead of back to the laser cavity making the laser less efficient. Therefore, a second order grating layer is an ideal candidate for edge-emitting lasers. Similarly etched facet lasers with a 45-degree-angle etched facet could be substituted for the second order grating.

Located above the waveguide stripe 140 and insulating layer 110 is a cap layer 170. Cap layer 170 depicted in FIG. 1 is a P-Cap layer which is a P-type semiconductor material. However, cap layer 170 is not limited to being a P-type semiconductor material and could be other types of semiconductor material such as an N-type semiconductor material.

Located above waveguide stripe 140 in cap layer 170 is an opening 180 allowing surface-emitting component 160 to be emitted. Located on either side of opening 180 are metal stripes 190.

In conventional edge-emitting lasers, a first order grating layer is present. A first order grating only provides an edge-emitting component indicated by arrow 150. A laser with a grating that is an order higher than one emits a surface-emitting component indicated by arrow 160 in addition to the edge-emitting component indicated by arrow 150. With an additional surface-emitting component represented by by arrow 160, testing of the laser can be performed from the surface of the laser instead from the edge of the laser as in the past. The surface-emitting component indicated by arrow 160 is used for on-wafer testing to obtain all the laser characteristics such as the current/voltage (I/V) relationship used to determine the terminal voltage, and the light/current (L/I) testing used for determining the power to current relations of each laser in one on-wafer measurement. Therefore, the cleaving process is eliminated and measurements can be obtained from the surface-emitting component (represented by arrow 160) present when using high order gratings.

Figure 2:
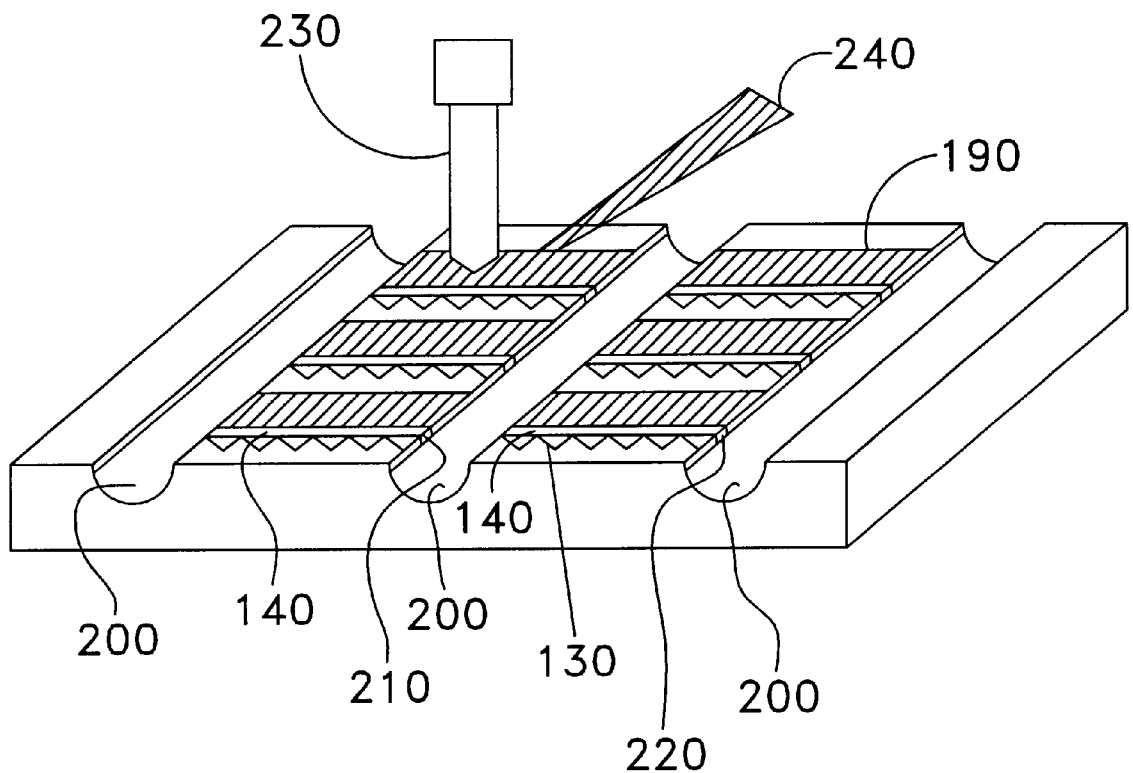
FIG. 2 is a perspective view of multiple edge-emitting lasers located on a single wafer.

Referring to FIG. 2, multiple coaxial channels 210 and 220 are located on a single substrate 105. Trenches 200 separate each coaxial channel 210 and 220. Electrode 240 is located on metal stripe 190 and lensed fiber 230 is located above opening 180 to receive the surface-emitting output indicated by arrow 160.

A method for fabricating an edge-emitting laser of the present invention comprises the steps of providing a substrate layer 105 and forming an insulating layer 110 on substrate layer 105 defining a channel 120 having insulating layers 110 located on either side of channel 120. The substrate layer depicted is an N-Substrate. However, substrate layer 105 is not limited to being an N-Substrate. For example, substrate layer 105 may be a P-Substrate. Insulating layer 110 is usually a regrown semi-insulating material such as a SI InP layer.

The method further comprises the steps of forming a grating layer 130 in channel 120 and forming a waveguide 140 over grating layer 130. Grating layer 130 is a high order grating such as a second order grating. However, any order grating greater than one or any grating that provides outputs in multiple directions is appropriate.

The next step comprises forming a cap layer 170 over waveguide 140 and insulating layer 110, forming an opening 180 in cap layer 170 above waveguide 140, and forming metal strips 190 on either side of opening 180. Forming opening 180 is typically accomplished by etching cap layer 170.

The final step comprises forming two channels 210 and 220 by forming a trench 200 across insulating layer 110 and channel 120.

Trench 200 is a deep trench and is typically etched below waveguide stripes 140. The length of laser cavity is defined by the length of channel 210 or 220 and is determined by a deep trench etching below waveguide stripe 140 forming a facet. The wafer is then subjected to a dicing procedure which will not affect the laser mode characteristics and eliminates the need for cleaving. The good lasers can then be directly picked up for packaging.

However, in some cases unacceptable lasers are reprocessed through a series of trimming steps that change the effective position of the etched facet. First the facet is coated with a variable amount of dielectric coating and the surface-emitting output 160 is monitored in situ with a fiber probe. In some cases, for instance, when the coating is too thick the facet may be etched. These coating and etching procedures are used as needed until the laser is acceptable. In principal, yields of close to 100% can be achieved.

A method for testing edge-emitting lasers located on a single substrate comprises the step of taking measurements from each surface emitting component represented by arrow 160 of each cavity 210 and 220.

A lensed fiber 230 is located above waveguide 140 to receive the surface-emitting component represented by arrow 160 and an electrode 240 is located on metal stripe 190.

The invention being thus described, it will be obvious that the same may be varied in many ways. Such variations are not to be regarded as a departure from the spirit and scope of the invention and all such modifications are intended to be included within the scope of the following claims.

What is claimed is:

1. A component of an edge-emitting laser comprising:
   a first resonator;
   a grating located in said first resonator having a grating order greater than one;
   a waveguide located in said first resonator;
   a cap layer located above said waveguide and said grating wherein said first resonator has an edge-emitting component being transmitted through said first resonator and a surface-emitting component being transmitted in a different direction than said edge-emitting component.

2. A component of an edge-emitting laser as claimed in claim 1 wherein said high order grating layer is a second order grating layer.

3. A component of an edge-emitting laser as claimed in claim 1 and further comprising a second resonator that is coaxial to said first resonator.

4. A component of an edge-emitting laser as claimed in claim 1 wherein said cap layer has an opening located above said waveguide and said grating.

5. A component of an edge-emitting laser as claimed in claim 4 wherein metal slabs are located on either side of said opening.

6. A method for testing at least two coaxial components of an edge-emitting laser, each component defining a resonator located on a single substrate wherein each component has an edge-emitting component and a surface-emitting component, the method comprising the steps of:
   exciting the laser component to make a laser emission from the surface-emitting component; and
   taking measurements from the surface-emitting component.

7. A method as claimed in claim 6 wherein said measurements are taken using a lensed fiber and an electrode.

8. A method as claimed in claim 6 wherein said measurements are taken using a lense and an electrode.

9. A method as claimed in claim 6 wherein each of said resonators is coated with a dielectric and said resonators are monitored by measuring said surface-emitting component of each resonator.

* * * * *